(12) United States Patent
Jin et al.

(10) Patent No.: US 12,490,629 B2
(45) Date of Patent: Dec. 2, 2025

(54) DISPLAY PANEL AND DISPLAY DEVICE

(71) Applicant: Wuhan China Star Optoelectronics Semiconductor Display Technology Co., Ltd., Hubei (CN)

(72) Inventors: Meng Jin, Hubei (CN); Lei Lv, Hubei (CN); Tao Yuan, Hubei (CN); Jinchang Huang, Hubei (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 148 days.

(21) Appl. No.: 17/285,105

(22) PCT Filed: Mar. 19, 2021

(86) PCT No.: PCT/CN2021/081697
§ 371 (c)(1),
(2) Date: Aug. 18, 2022

(87) PCT Pub. No.: WO2022/170660
PCT Pub. Date: Aug. 18, 2022

(65) Prior Publication Data
US 2024/0032381 A1  Jan. 25, 2024

(30) Foreign Application Priority Data
Feb. 9, 2021  (CN) .......................... 202110181264.1

(51) Int. Cl.
*H10K 59/65*  (2023.01)
*H10K 59/122*  (2023.01)
*H10K 102/00*  (2023.01)

(52) U.S. Cl.
CPC .......... *H10K 59/65* (2023.02); *H10K 59/122* (2023.02); *H10K 2102/351* (2023.02)

(58) Field of Classification Search
CPC . H10K 59/65; H10K 59/122; H10K 2102/351
See application file for complete search history.

(56) References Cited

U.S. PATENT DOCUMENTS 11,925,095 B2 * 3/2024 Jin ....................... H10K 59/122
2014/0361260 A1 * 12/2014 Kim ..................... H10K 59/122
438/23

(Continued)

FOREIGN PATENT DOCUMENTS

| CN | 101488515 | 7/2009 |
| CN | 102332535 | 1/2012 |

(Continued)

*Primary Examiner* — Dale E Page
*Assistant Examiner* — Rohit Parthasarathy

(57) ABSTRACT

The present invention discloses a display panel and a display device. In a first display area, the display panel includes pixel areas and a light-transmitting area, and further includes: a light-emitting unit layer; an auxiliary layer including at least one auxiliary part, wherein the auxiliary part is disposed in a light-transmitting area; and a first electrode layer. The auxiliary part comprises a platform part and an edge part, the first electrode layer covers the light-emitting unit layer and at least part of the edge part, and a thickness of the first electrode layer located on the edge part is less than a thickness of the first electrode layer located on the light-emitting unit layer.

15 Claims, 4 Drawing Sheets

(56) References Cited

U.S. PATENT DOCUMENTS

| | | | | |
|---|---|---|---|---|
| 2017/0069696 | A1* | 3/2017 | Kondo | H10D 86/411 |
| 2017/0084669 | A1* | 3/2017 | Wolk | G02B 5/201 |
| 2018/0226581 | A1* | 8/2018 | Chang | H10K 71/166 |
| 2021/0280825 | A1* | 9/2021 | Beon | H10K 50/844 |
| 2021/0313539 | A1* | 10/2021 | Jeon | H10K 50/822 |
| 2021/0343988 | A1* | 11/2021 | Gao | H10K 71/00 |
| 2022/0013594 | A1* | 1/2022 | Wang | H10K 50/824 |
| 2023/0354676 | A1* | 11/2023 | Jin | H10K 59/122 |
| 2024/0032344 | A1* | 1/2024 | Jin | H10K 59/122 |

FOREIGN PATENT DOCUMENTS

| | | |
|---|---|---|
| CN | 103489890 | 1/2014 |
| CN | 103700685 | 4/2014 |
| CN | 104347669 | 2/2015 |
| CN | 105474752 | 4/2016 |
| CN | 111029392 | 4/2020 |
| CN | 111384284 | 7/2020 |
| CN | 111697029 | 9/2020 |
| CN | 111834432 | 10/2020 |
| EP | 3306697 | 4/2018 |
| WO | WO 2020/134007 | 7/2020 |

* cited by examiner

DISPLAY PANEL AND DISPLAY DEVICE

RELATED APPLICATIONS

This application is a National Phase of PCT Patent Application No. PCT/CN2021/081697 having International filing date of Mar. 19, 2021, which claims the benefit of priority of Chinese Patent Application No. 202110181264.1 filed on Feb. 9, 2021. The contents of the above applications are all incorporated by reference as if fully set forth herein in their entirety.

FIELD AND BACKGROUND OF THE INVENTION

The present invention relates to the field of display technology and in particular to a display panel and a display device.

BACKGROUND OF INVENTION

In existing camera under panel (CUP) display technology, a display panel includes a first display area used for both display and a camera and a second display area only used for display. In order to improve camera effect of the camera, a cathode in a light-transmitting area of the first display area is usually removed to increase light transmittance of the display panel in this area.

However, due to an obvious difference in a thickness of the cathode between the light-transmitting area and an area outside the light-transmitting area, an obvious cathode step difference appears at a boundary of the light-transmitting area, resulting in an obvious unevenness in brightness at the boundary of the light-transmitting area and reducing brightness uniformity of the display panel.

SUMMARY OF THE INVENTION

Embodiments of the present invention provide a display panel and a display device, which can alleviate a phenomenon of uneven brightness at the boundary of the light-transmitting area, and improve the brightness uniformity of the display panel.

The embodiments of the present invention provide a display panel comprising a first display area and a second display area, a light transmittance of the first display area is greater than a light transmittance of the second display area, in the first display area, the display panel comprises pixel areas and a light-transmitting area defined between the pixel areas, and the display panel comprises:
  a light-emitting unit layer;
  an auxiliary layer comprising at least one auxiliary part, wherein the auxiliary part is disposed in a corresponding light-transmitting area; and
  a first electrode layer disposed on the light-emitting unit layer and the auxiliary layer,
  the auxiliary part comprises a platform part and an edge part arranged at an edge of the platform part, the first electrode layer covers the light-emitting unit layer and at least part of the edge part, and a thickness of the first electrode layer located on the edge part is less than a thickness of the first electrode layer located on the light-emitting unit layer.

Alternatively, in some embodiments of the present invention, an adhesive force of the first electrode layer on the auxiliary layer is less than an adhesive force of the first electrode layer on the light-emitting unit layer.

Alternatively, in some embodiments of the present invention, a thickness of the first electrode layer located on the auxiliary part is less than the thickness of the first electrode layer located on the light-emitting unit layer.

Alternatively, in some embodiments of the present invention, the adhesive force of the first electrode layer on the auxiliary layer gradually decreases as a thickness of the auxiliary layer increases.

Alternatively, in some embodiments of the present invention, the thickness of the first electrode layer located on the edge part gradually decreases in a direction in which a thickness of the edge part increases.

Alternatively, in some embodiments of the present invention, the thickness of the edge part gradually decreases in a direction away from the platform part.

Alternatively, in some embodiments of the present invention, the first electrode layer only covers a part of the edge part on the auxiliary layer.

Alternatively, in some embodiments of the present invention, the first electrode layer completely covers the edge part on the auxiliary layer.

Alternatively, in some embodiments of the present invention, the first electrode layer completely covers the edge part and the platform part on the auxiliary layer.

Alternatively, in some embodiments of the present invention, the thickness of the first electrode layer located on the light-emitting unit layer ranges from 100 nanometers to 150 nanometers.

Alternatively, in some embodiments of the present invention, the display panel further comprises a pixel definition layer, the pixel definition layer is patterned to form openings of the pixel definition layer, and a distance between an edge of the auxiliary part and adjacent one of the openings of the pixel definition layer ranges from 2 microns to 5 microns.

Alternatively, in some embodiments of the present invention, a width of a projection of the edge part on the light-emitting unit layer ranges from 2 microns to 5 microns.

Alternatively, in some embodiments of the present invention, a contact angle between the auxiliary layer and the light-emitting unit layer ranges from 0 degrees to 90 degrees.

Alternatively, in some embodiments of the present invention, a thickness of the platform part is less than or equal to the thickness of the first electrode layer located on the light-emitting unit layer.

Correspondingly, the embodiments of the present invention also provide a display device comprising a display panel, the display panel comprises a first display area and a second display area, a light transmittance of the first display area is greater than a light transmittance of the second display area, in the first display area, the display panel comprises pixel areas and a light-transmitting area defined between the pixel areas, and the display panel comprises:
  a light-emitting unit layer;
  an auxiliary layer comprising at least one auxiliary part, wherein the auxiliary part is disposed in a corresponding light-transmitting area; and
  a first electrode layer disposed on the light-emitting unit layer and the auxiliary layer,
  the auxiliary part comprises a platform part and an edge part arranged at an edge of the platform part, the first electrode layer covers the light-emitting unit layer and at least part of the edge part, and a thickness of the first electrode layer located on the edge part is less than a thickness of the first electrode layer located on the light-emitting unit layer.

Alternatively, in some embodiments of the present invention, a thickness of the first electrode layer located on the auxiliary part is less than the thickness of the first electrode layer located on the light-emitting unit layer.

Alternatively, in some embodiments of the present invention, the thickness of the first electrode layer located on the edge part gradually decreases in a direction in which a thickness of the edge part increases.

Alternatively, in some embodiments of the present invention, the first electrode layer only covers a part of the edge part on the auxiliary layer.

Alternatively, in some embodiments of the present invention, the first electrode layer completely covers the edge part on the auxiliary layer.

Alternatively, in some embodiments of the present invention, the first electrode layer completely covers the edge part and the platform part on the auxiliary layer.

The embodiments of the present invention provide a display panel and a display device. The display panel comprises a first display area and a second display area, a light transmittance of the first display area is greater than a light transmittance of the second display area, in the first display area, the display panel comprises pixel areas and a light-transmitting area defined between the pixel areas, and the display panel comprises: a light-emitting unit layer; an auxiliary layer comprising at least one auxiliary part, wherein the auxiliary part is disposed in a corresponding light-transmitting area; and a first electrode layer disposed on the light-emitting unit layer and the auxiliary layer, the auxiliary part comprises a platform part and an edge part arranged at an edge of the platform part, the first electrode layer covers the light-emitting unit layer and at least part of the edge part, and a thickness of the first electrode layer located on the edge part is less than a thickness of the first electrode layer located on the light-emitting unit layer. In the embodiments of the present invention, the auxiliary part is provided in the light-emitting area, the first electrode layer covers the light-emitting unit layer and at least part of the edge part, and the thickness of the first electrode layer located on the edge part is less than the thickness of the first electrode layer located on the light-emitting unit layer, thereby reducing the cathode step difference at the boundary of the light-transmitting area, alleviating the phenomenon of uneven brightness at the boundary of the light-transmitting area, and improving the brightness uniformity of the display panel.

BRIEF DESCRIPTION OF THE SEVERAL VIEWS OF THE DRAWINGS

The technical solutions, as well as other beneficial advantages, of the present invention will be apparent from the following detailed descriptions of embodiments of the present invention, with reference to the attached drawings.

DESCRIPTION OF SPECIFIC EMBODIMENTS OF THE INVENTION

The embodiments of the present invention provide a display panel, a method for manufacturing the same, and a display device, so as to improve the brightness uniformity of the display panel. The detailed description will be given below. It should be noted that the description order of the following embodiments is not intended to limit the preferred order of the embodiments.

Figure 1:
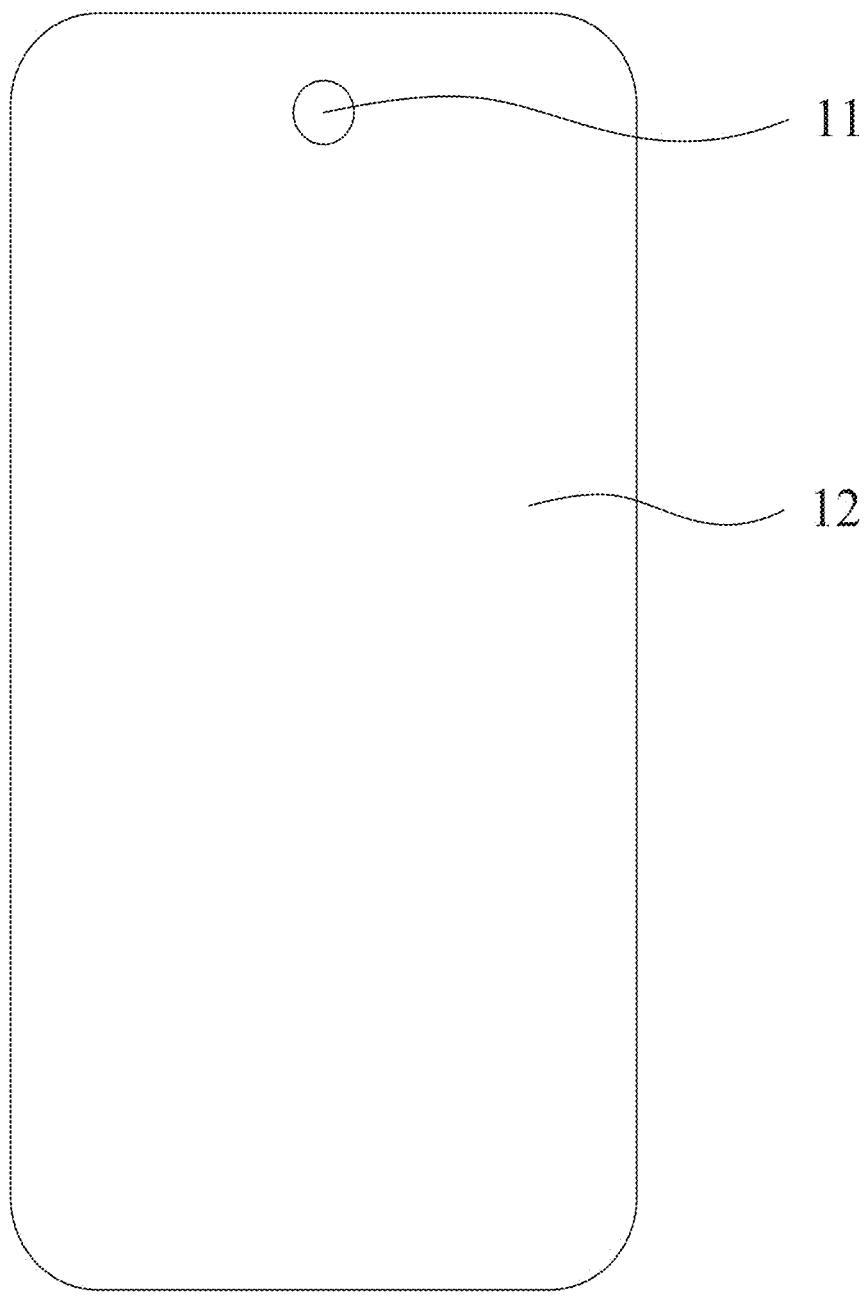
FIG. 1 is a schematic view of a first plan structure of a display panel in accordance with an embodiment of the present invention.
Figure 2:
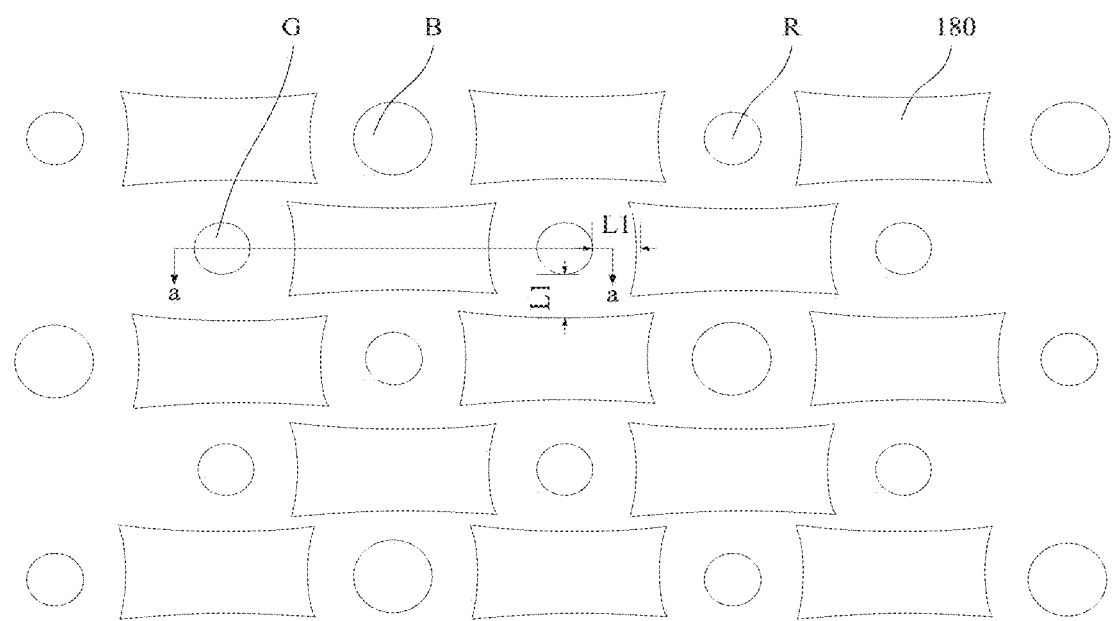
FIG. 2 is a schematic view of a second plan structure of the display panel in accordance with an embodiment of the present invention.
Figure 3:
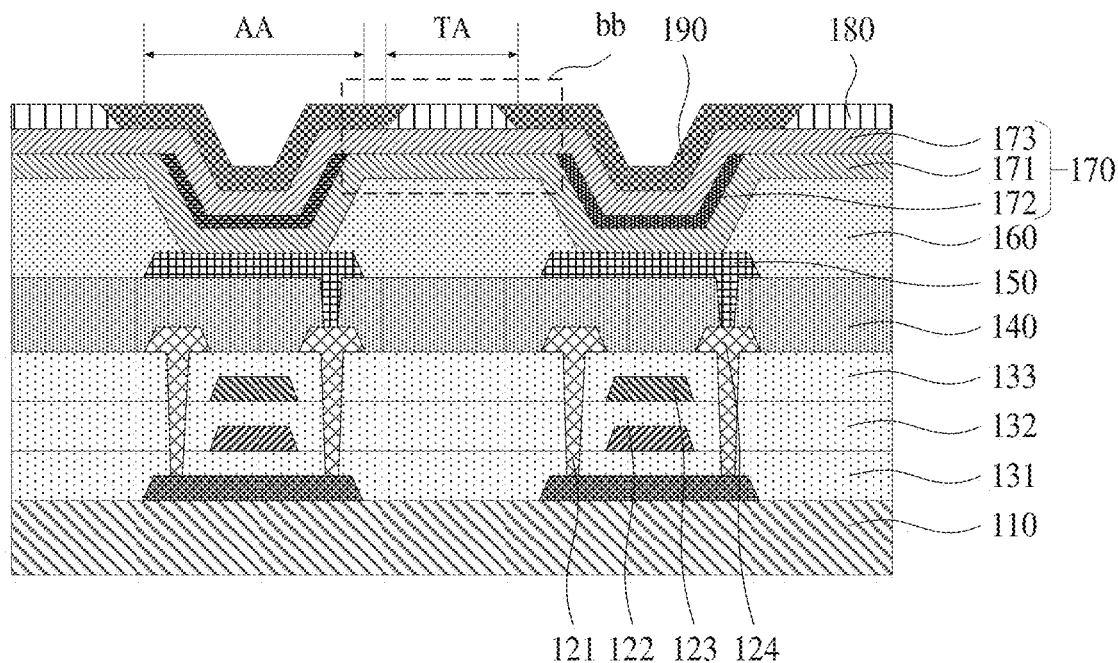
FIG. 3 is a schematic view of a first cross-sectional structure of the display panel in accordance with an embodiment of the present invention.
Figure 4:
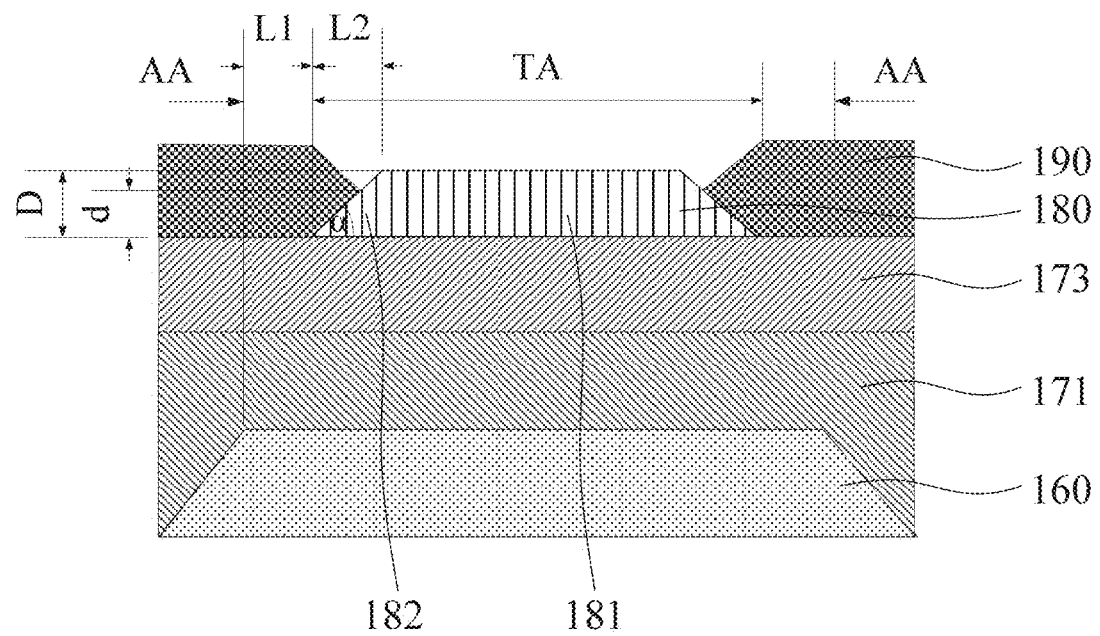
FIG. 4 is a schematic view of a second cross-sectional structure of the display panel in accordance with an embodiment of the present invention.
Figure 5:
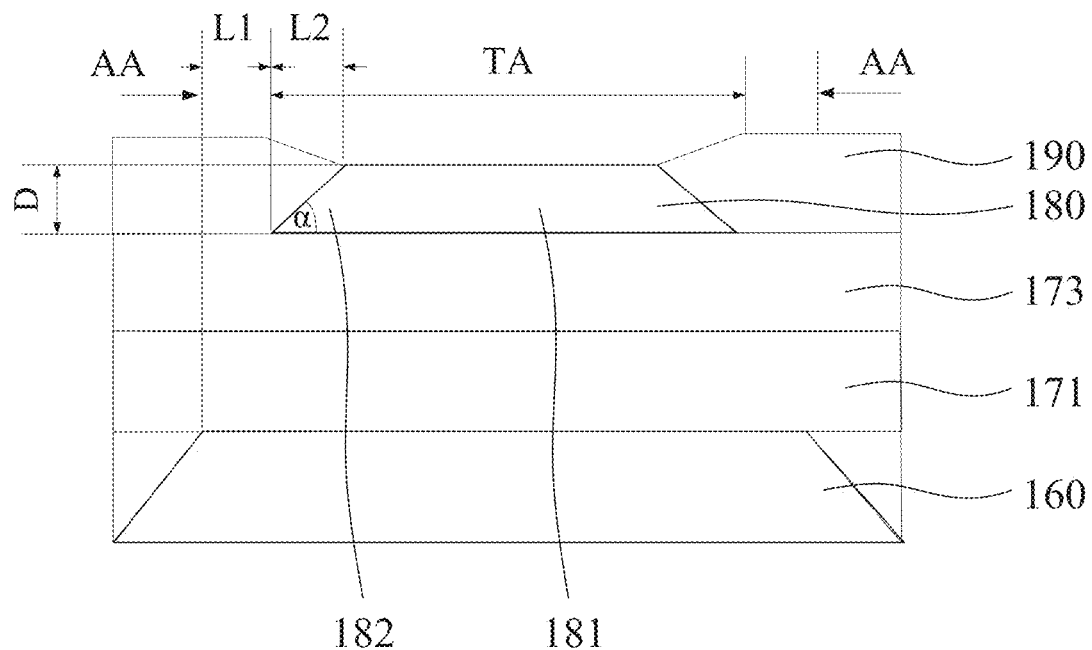
FIG. 5 is a schematic view of a third cross-sectional structure of the display panel in accordance with an embodiment of the present invention.
Figure 6:
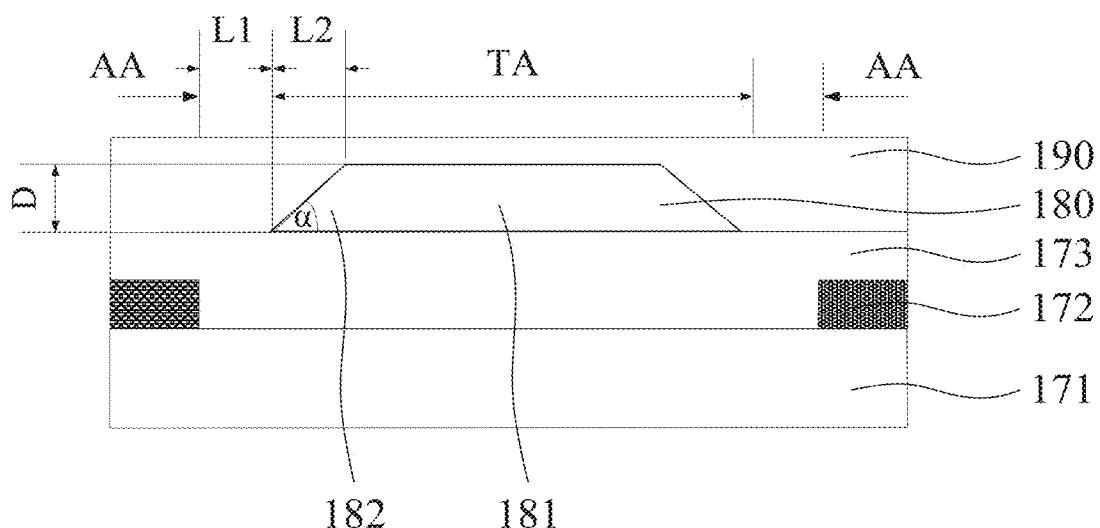
FIG. 6 is a schematic view of a fourth cross-sectional structure of the display panel in accordance with an embodiment of the present invention.

In an embodiment, please refer to FIG. 1 to FIG. 6. FIG. 1 shows a schematic view of a first plan structure of a display panel provided in an embodiment of the present invention; FIG. 2 shows a schematic view of a second plan structure of the display panel provided in the embodiment of the present invention. Specifically, FIG. 2 is a schematic view of a partial plan structure of a first display area of the display panel provided in the embodiment of the present invention; FIG. 3 shows a schematic view of a first cross-sectional structure of the display panel provided in the embodiment of the present invention. Specifically, FIG. 3 is a schematic view of a partial cross-sectional structure of the first display area of the display panel provided in the embodiment of the present invention; that is, a schematic view of a cross-sectional structure along a line aa in FIG. 2; FIG. 4 shows a schematic view of a second cross-sectional structure of the display panel provided in the embodiment of the present invention. Specifically, FIG. 4 is a first partial enlarged schematic view of area bb in FIG. 3; FIG. 5 shows a schematic view of a third cross-sectional structure of the display panel provided in the embodiment of the present invention. Specifically, FIG. 5 is a second partial enlarged schematic view of area bb in FIG. 3; and FIG. 6 shows a schematic view of a fourth cross-sectional structure of the display panel provided in the embodiment of the present invention. Specifically, FIG. 6 is a third partial enlarged schematic view of area bb in FIG. 3. As shown, the display panel 10 provided by the embodiment of the present invention comprises a first display area 11 and a second display area 12, a light transmittance of the first display area 11 is greater than a light transmittance of the second display area 12. In the first display area 11, the display panel 10 comprises pixel areas AA and a light-transmitting area TA defined between the pixel areas. The display panel 10 comprises a light-emitting unit layer 170, an auxiliary layer 180, and a first electrode layer 190. The auxiliary layer 180 comprises at least one auxiliary part 180, and the auxiliary part 180 is disposed in a corresponding light-transmitting area TA. The first electrode layer 190 is disposed on the light-emitting unit layer 170 and the auxiliary layer 180. The auxiliary part 180 comprises a platform part 181 and an edge part 182 arranged at an edge of the platform part 181, the first electrode layer 190 covers the light-emitting unit layer 170 and at least part of the edge part 182, and a thickness of the first electrode layer 190 located on the edge part 182 is less than a thickness of the first electrode layer 190 located on the light-emitting unit layer 170.

The embodiment of the present invention provides a display panel, the display panel is provided with the auxiliary part in the light-emitting area, the first electrode layer covers the light-emitting unit layer and at least part of the edge part, and a thickness of the first electrode layer located on the edge part is less than a thickness of the first electrode layer located on the light-emitting unit layer, thereby reducing the cathode step difference at the boundary of the light-transmitting area, alleviating the phenomenon of uneven brightness at the boundary of the light-transmitting area, and improving the brightness uniformity of the display panel.

The display panel provided by the embodiment of the present invention will be further explained below with specific embodiments in combination with the accompanying drawings. The following embodiments are only to illustrate the display panel provided by the present invention, and are not intended to limit the display panel provided by the present invention. Any display panel that conforms to the inventive concept of the present invention shall fall within the protection scope of the present invention.

In one embodiment, as shown in FIG. 3, the display panel provided by an embodiment of the present invention specifically comprises an array substrate, a second electrode layer 150, a pixel definition layer 160, a light-emitting unit layer 170, an auxiliary layer 180, and a first electrode layer 190.

The array substrate further comprises a substrate 110, a semiconductor active layer 121, a first insulating layer 131, a first gate electrode layer 122, a second insulating layer 132, a second gate electrode layer 123, a third insulating layer 133, a source and drain layer 124, and a planarization layer 140 arranged in sequence from bottom to top. The substrate 110 may be a rigid substrate or a flexible substrate. The rigid substrate is generally a glass substrate, and the flexible substrate generally includes a first organic substrate, an inorganic substrate, and a second inorganic substrate. The semiconductor active layer 121 is patterned to form an active area of a thin film transistor. A material of the semiconductor active layer 121 may be an oxide semiconductor material, or may be a polysilicon material or a single crystal silicon material. The first gate electrode layer 122 is patterned to form a first gate electrode of the thin film transistor, and the second gate electrode layer 123 is patterned to form a second gate electrode of the thin film transistor. The source and drain layer 124 is patterned to form a source electrode and a drain electrode of the thin film transistor. The thin film transistor and signal lines together constitute a driving circuit of the display panel 10, and they are used to drive the light-emitting unit layer 170 for light-emitting display. The first insulating layer 131 is disposed between the semiconductor active layer 121 and the first gate electrode layer 122, the second insulating layer 132 is disposed between the first gate electrode layer 122 and the second gate electrode layer 123, the third insulating layer 133 is disposed between the second gate electrode layer 123 and the source and drain layers 124, and the first insulating layer 131, the second insulating layer 132 and the third insulating layer 133 are respectively used to isolate two adjacent conductive layers. The planarization layer 140 is used to planarize the array substrate and provide a planar substrate for a preparation of the second electrode layer 150 on the planarization layer 140. A material of the planarization layer 140 is generally organic.

The second electrode layer 150 is formed on the array substrate and is patterned to form second electrodes 150 spaced apart from and independent of each other. The second electrodes 150 are located in the pixel area AA of the display panel 10.

The pixel definition layer 160 is formed on the second electrode layer 150, and is patterned to form openings spaced apart. The openings are located in the pixel area AA corresponding to the second electrodes 150 and exposing the second electrodes 150.

The light-emitting unit layer 170 is formed on the second electrode layer 150 and the pixel definition layer 160. The light-emitting unit layer 170 comprises a first light-emitting unit layer 171, a second light-emitting unit layer 172, and a third light-emitting unit layer 173. When the first electrode layer 190 is a common electrode layer and the second electrode layer 150 is a pixel electrode layer, the first light-emitting unit layer 171 is a hole transport layer and the third light-emitting unit layer 173 is an electron transport layer; and when the first electrode layer 190 is a pixel electrode layer and the second electrode layer 150 is a common electrode layer, the first light-emitting unit layer 171 is an electron transport layer and the third light-emitting unit layer 173 is a hole transport layer. In this embodiment of the present invention, as an example, the first electrode layer 190 is a common electrode layer and the second electrode layer 150 is a pixel electrode layer. The hole transport layer is made of a material with high hole mobility, high thermal stability, and good electron and exciton blocking ability. A material of the hole transport layer is generally one or more of 2TNATA, NPB, or TAPC. The electron transport layer is made of a material with high electron mobility, high thermal stability, and good hole and exciton blocking ability. The material of the electron transport layer is one or more of TPBi, BPhen, or TmPyPB. The second light-emitting unit layer 172 is a light-emitting material layer, including a red light-emitting material layer, a green light-emitting material layer, and a blue light-emitting material layer, and it is used to emit corresponding pixel colors. As shown in FIG. 2, the pixels include red pixels R, green pixels G, and blue pixels B. In this embodiment of the present invention, a structure of the pixels may be the structure shown in FIG. 2 or other structures well-known in the art, which is not limited herein. In order to improve an efficiency of electron and hole injection into the light-emitting material layer, the first light-emitting unit layer 171 may further be a composite film layer of a hole transport layer and a hole injection layer, and the hole injection layer is located between the hole transport layer and the light-emitting material. The third light-emitting unit layer 173 may further be a composite film layer of an electron transport layer and an electron injection layer, and the electron injection layer is located between the electron transport layer and the light-emitting material layer. The first light-emitting unit layer 171 is provided as a whole layer, it is covering the pixel area AA and the light-transmitting area TA, and it is deposited on the pixel definition layer 160, it covers the openings of the pixel definition layer 160 and it is in contact with the second electrode 150. The second light-emitting unit layer 172 is provided in the pixel area AA, it is deposited on the first light-emitting unit layer 171 and corresponds to the second electrode 150. The third light-emitting unit layer 173 is provided as a whole layer, it is covering the pixel area AA and the light-transmitting area TA, and it is deposited on the first light-emitting unit layer 171 and the second light-emitting unit layer 172.

The auxiliary layer 180 is disposed on the third light-emitting unit layer 173, and it is patterned to form auxiliary parts 180 spaced apart from and independent of each other. The auxiliary parts 180 are located in the corresponding light-transmitting area TA. A distance L1 between an edge of the auxiliary part 180 and the opening of the pixel definition layer 160 ranges from 2 microns to 5 microns, and a projection of the auxiliary part 180 on the substrate 110 does not overlap with a projection of the second electrode 150 on the substrate. The auxiliary part 180 comprises a platform part 181 located in the middle of the auxiliary part 180 and an edge part 182 located at an edge of the platform part 181. A thickness of the edge part 182 gradually decreases in a direction away from the platform part 181. A projection width L2 of the edge part 182 on the third light-emitting unit layer 173 ranges from 2 microns to 5 microns. A contact angle α between the auxiliary layer 180 and the third light-emitting unit layer ranges from 0 degrees to 90 degrees. As shown in FIGS. 4-6, in one embodiment, a side of the auxiliary part 180 is a straight line connecting an upper top surface and a lower bottom surface of the auxiliary part 180, and a cross-section of the auxiliary part 180 is a regular trapezoidal structure. In other embodiment, a side of the auxiliary part 180 can also be a curve, arc, or fold line connecting a top surface and a bottom surface of the auxiliary part 180. That is, a shape of the auxiliary part 180 is an irregular structure. In the display panel provided in the embodiments of the present invention, all structures of the auxiliary part 180 that meet the requirement that a thickness of the edge part 182 gradually decreases in the direction away from the platform part 181 are within the technical scope of the present invention. In the display panels provided in the embodiments of the present invention, a material of the auxiliary layer 180 is a transparent anti-adhesion material, specifically a material with weak adhesion and surface energy mismatch with the first electrode layer 190, which includes but is not limited to N, N'-diphenyl-N,N'-bis(9-phenyl-9H-carbazol-3-yl) biphenyl-4,4'-diamine, N-(biphenyl-4-yl)-9,9-dimethyl-N-(4-(9-phenyl-9H-carbazol-3-yl)phenyl)-9H-fluoren-2-amine, 2-(4-(9,10-bis(naphthalene-2-yl)anthracene-2-yl)phenyl)-1-phenyl-1H-benzo-[D]imidazole, 4,4',4''-tris(N-3-methylphenyl-N-phenylamino)triphenylamine, N,N'-bis(1-naphthyl)-N,N'-diphenyl [1,1'-biphenyl]-4,4'-diamine or 4,4'-Bis [N-(3-methylphenyl)-N-phenylamino]biphenyl, BAlq(bis(2-methyl-8-hydroxyquinoline)-4-(p-phenylphenol)) aluminum alloy), or TAZ (3-(biphenyl-4-yl)-5-(4-tert-butylphenyl)-4-phenyl-4H-1,2,4-triazole).

The first electrode layer 190 is disposed on the third light-emitting unit layer 173 and the auxiliary layer 180 and covers the third light-emitting unit layer 173. The first electrode layer 190 is a non-transparent electrode layer, it has a function of reflecting the light emitted by the second light-emitting unit layer 172, and at the same time has a function of blocking external light from entering the display panel 10 through the light-transmitting area TA. In an embodiment, the first electrode layer 190 is a common electrode layer, which may be made of a metal with a low work function, including silver (Ag), magnesium (Mg), aluminum (Al), platinum (Pt), palladium (Pd), gold (Au), nickel (Ni), neodymium (Nd), iridium (Ir), chromium (Cr), lithium (Li), or calcium (Ca). Preferably, the first electrode layer 190 is magnesium or a magnesium alloy metal layer.

As shown in FIG. 4 to FIG. 6, since the material of the auxiliary layer 180 is an anti-adhesion material, the anti-adhesion material does not match the surface energy of the material of the first electrode layer 190, and the material of the third light-emitting unit layer 173 is a non-adhesion-proof material, which matches the surface energy of the material of the first electrode layer 190, so that an adhesive force of the first electrode layer 190 on the auxiliary layer 180 is less than an adhesive force of the first electrode layer 190 on the third light-emitting unit layer 173, thus a thickness of the first electrode layer 190 located on the auxiliary layer 180 is less than a thickness of the first electrode layer 190 located on the third light-emitting unit layer 173. Since the adhesive force of the first electrode layer 190 on the auxiliary layer 180 gradually decreases as the thickness of the auxiliary layer 180 increases, and when the thickness of the auxiliary layer 180 reaches a certain value d, the adhesive force of the first electrode layer 190 on the auxiliary layer 180 reaches a limit value. The first electrode layer 190 shall be unable to adhere to the auxiliary layer 180, that is, the first electrode layer 190 is not provided on the auxiliary layer 180 with a thickness greater than the value d, thus the first electrode layer 190 covers at least part of the edge part 182 of the auxiliary layer 180, and the thickness of the first electrode layer 190 located on the edge part 182 gradually decreases in a direction in which the thickness of the edge part 182 increases. The thickness of the first electrode layer 190 located on the edge part 182 is the same as the thickness of the first electrode layer 190 located on the third light-emitting unit layer 173. This makes the thickness of the first electrode layer 190 transition smoothly at the boundary of the light-transmitting area TA, thereby greatly reducing the cathode step difference at the boundary of the light-transmitting area TA, alleviating the phenomenon of uneven brightness at the boundary of the light-transmitting area TA, and improving the brightness uniformity of the display panel.

In summary, by controlling the thickness of the auxiliary layer 180, a deposition thickness of the first electrode layer 190 on the auxiliary layer 180 can be controlled, so that a corresponding part of the first electrode layer 190 can be removed or the first electrode layer 190 can be thinned. In this embodiment of the present invention, the thickness of the first electrode layer 190 located on the third light-emitting unit layer 173 ranges from 100 nanometers to 150 nanometers, and the thickness of the platform part 181 of the auxiliary layer 180 is less than or equal to the thickness of the first electrode layer 190 located on the third light-emitting unit layer 173.

In an embodiment, as shown in FIG. 4, the thickness D of the auxiliary layer 180 is greater than the value d, and the first electrode layer 190 covers a part of the edge part 182 of the auxiliary layer 180. Since the thickness of the edge part 182 gradually increases in a direction approaching the platform part 181, the adhesive force of the first electrode layer 190 on the edge part 182 gradually decreases in a direction approaching the platform part 181, thus the thickness of the first electrode layer 190 located on the edge part 182 gradually decreases in a direction approaching the platform part 181. When the thickness of the edge part 182 increases to the value d, the adhesive force of the first electrode layer 190 on the edge part 182 is reduced to a limit value, the first electrode layer 190 shall not adhere to the edge part 182 with a thickness greater than the value d and the platform part 181 with a thickness D. The thickness of the first electrode layer 190 is reduced to 0, so that the first electrode layer 190 only covers the edge part 182 with a thickness less than or equal to the value d. The first electrode layer 190 is not adhered to the part where the thickness of the edge part 182 is greater than the value d and the platform part 181. In this way, since the first electrode layer 190 is not adhered to a portion of the edge part 182 with a thickness greater than the value d and the platform portion 181, the first electrode layer 190 is not disposed in the light-transmitting area TA corresponding to this portion. This reduces a blocking of external light by the metal reflective electrode in the light-transmitting area TA and improves the light transmittance of the light-transmitting area TA. Since a portion of the edge part 182 with a thickness less than or equal to the value d is adhered to the first electrode layer 190, a certain metal reflective electrode remains in the light-transmitting area TA, it can reflect the light emitted by the second light-emitting unit layer 172, reduce the brightness of the light-transmitting area TA, reduce the brightness difference between the first display area and the second display area, and improve the brightness uniformity of the display panel. In addition, since the thickness of the first electrode layer 190 gradually decreases on the edge part 182 along the direction approaching the platform part 181, and the thickness of the first electrode layer 190 located at the edge of the auxiliary layer 180 is the same as that of the first electrode layer 190 on the third light-emitting unit layer 173, so that the thickness of the first electrode layer 190 transitions smoothly at the boundary of the light-transmitting area TA, and the thickness of the first electrode layer 190 in the light-transmitting area TA gradually decreases in a direction away from the pixel area AA, hence a light transmittance of the display panel transitions smoothly at the boundary of the light-transmitting area TA and gradually increases in the direction away from the pixel area AA. A blocking intensity of the first electrode layer 190 to the light emitted by the third light-emitting unit layer 173 smoothly transitions at the boundary of the light-transmitting area TA and gradually decreases in the direction away from the pixel area AA, which further improves the brightness uniformity of the display panel.

In another embodiment, as shown in FIG. 5, the thickness D of the auxiliary layer 180 is equal to the value d, and the first electrode layer 190 completely covers the edge part 182 of the auxiliary layer 180 and does not cover the platform part 181 of the auxiliary layer 180. The thickness of the edge part 182 gradually increases in a direction approaching the platform part 181, the adhesive force of the first electrode layer 190 on the edge part 182 gradually decreases in a direction approaching the platform part 181, the thickness of the first electrode layer 190 located on the edge part 182 gradually decreases in a direction approaching the platform part 181. When the thickness of the edge part 182 increases to the value d, the thickness of the first electrode layer 190 is reduced to 0, so that the first electrode layer 190 only covers the edge part 182 but not the platform part 181. Similarly, the platform part 181 is not covered by the first electrode layer 190, which improves the light transmittance of the light-transmitting area TA; the edge part 182 is covered with the first electrode layer 190, and the first electrode layer 190 reflects the light emitted by the second light-emitting unit layer 172, which reduces the brightness of the light-transmitting area TA, reduces the brightness difference between the first display area and the second display area, and improves the brightness uniformity of the display panel. The thickness of the first electrode layer 190 gradually decreases on the edge part 182 along the direction approaching the platform part 181, and the thickness of the first electrode layer 190 located at the edge of the auxiliary layer 180 is same as that of the first electrode layer 190 on the third light-emitting unit layer 173, so that a light transmittance of the display panel transitions smoothly at the boundary of the light-transmitting area TA and gradually increases in the direction away from the pixel area AA. A blocking intensity of the first electrode layer 190 to the light emitted by the third light-emitting unit layer 173 smoothly transitions at the boundary of the light-transmitting area TA and gradually decreases in the direction away from the pixel area AA, which further improves the brightness uniformity of the display panel.

In yet another embodiment, as shown in FIG. 6, the thickness D of the auxiliary layer 180 is less than the value d, and the first electrode layer 190 completely covers the edge part 182 and the platform part 181 of the auxiliary layer 180. The thickness of the edge part 182 gradually increases in a direction approaching the platform part 181, the adhesive force of the first electrode layer 190 on the edge part 182 gradually decreases in a direction approaching the platform part 181, the thickness of the first electrode layer 190 located on the edge part 182 gradually decreases in a direction approaching the platform part 181. When the thickness of the edge part 182 increases to the value D, since the value D is less than the value d, the first electrode layer 190 can continue to adhere to the auxiliary part 180 with a thickness of the value D. Therefore, the first electrode layer 190 completely covers the edge part 182 and the platform part 181, and the thickness of the first electrode layer 190 covering the platform part 181 is less than the thickness of the first electrode layer 190 covering the edge part 182. In this way, the first electrode layer 190 with a reduced thickness is provided on the platform part 181 and the edge part 182, which improves the light transmittance of the light-transmitting area TA. The first electrode layer 190 covers the platform part 181 and the edge part 182 and reflects the light emitted by the second light-emitting unit layer 172, further reducing the brightness of the light-transmitting area TA, reducing the brightness difference between the first display area and the second display area and improving the brightness uniformity of the display panel. The thickness of the first electrode layer 190 gradually decreases on the edge part 182 along the direction approaching the platform part 181, and the thickness of the first electrode layer 190 located at the edge of the auxiliary layer 180 is the same as that of the first electrode layer 190 on the third light-emitting unit layer 173, so that a light transmittance of the display panel transitions smoothly at the boundary of the light-transmitting area TA and gradually increases in the direction away from the pixel area AA. A blocking intensity of the first electrode layer 190 to the light emitted by the third light-emitting unit layer 173 smoothly transitions at the boundary of the light-transmitting area TA and gradually decreases in the direction away from the pixel area AA, which further improves the brightness uniformity of the display panel while ensuring the light transmittance of the display panel.

The embodiments of the present invention also provide a method for manufacturing a display panel, which is used to prepare the display panel provided in any of the embodiments of the present invention, and the method includes:

S1, preparing a light-emitting unit layer.

Specifically, a first light-emitting unit layer is vapor-deposited on a pixel definition layer. The first light-emitting unit layer is provided as a whole layer, covers pixel areas and a light-transmitting area, is deposited on the pixel definition layer, covers openings of the pixel definition layer, and is in contact with a second electrode. The first light-emitting unit layer is a hole transport layer or a composite film layer of a hole transport layer and a hole injection layer, and the hole transport layer is located between the hole injection layer and the second electrode layer. In the pixel area AA, a second light-emitting unit layer is vapor-deposited on the light-emitting unit layer, and the second light-emitting unit layer corresponds to the second electrode of the pixel area where it is located. The second light-emitting unit layer is a light-emitting material layer including a red light-emitting material layer, a green light-emitting material layer, and a blue light-emitting material layer. The third light-emitting unit layer is vapor-deposited on the first light-emitting unit layer and the second light-emitting unit layer, the third light-emitting unit layer is provided as a whole layer, and covers the pixel area and the light-transmitting area. The third light-emitting unit layer is an electron transport layer or a composite film layer of an electron transport layer and an electron injection layer, and the electron injection layer is located between the electron transport layer and the light-emitting material layer.

S2. preparing an auxiliary layer in the light-transmitting area. The auxiliary layer includes at least one auxiliary part, and the auxiliary part includes a platform part and an edge part located at an edge of the platform part.

Specifically, a set of fine masks is used to prepare an auxiliary layer on the third light-emitting unit layer, so as to form auxiliary parts spaced apart from and independent of each other. The auxiliary parts are located in the corresponding light-transmitting area. A distance between an edge of the auxiliary part and the opening of the pixel definition layer ranges from 2 microns to 5 microns. The auxiliary part comprises a platform part located in the middle of the auxiliary part and an edge part located at an edge of the platform part. A thickness of the edge part gradually decreases in a direction away from the platform part. A width of a projection of the edge part on the third light-emitting unit layer ranges from 2 microns to 5 microns. A contact angle between the auxiliary layer and the third light-emitting unit layer ranges from 0 degrees to 90 degrees. A material of the auxiliary layer is a transparent anti-adhesion material, specifically a material with weak adhesion and surface energy mismatch with the first electrode layer, which includes but is not limited to N, N'-diphenyl-N,N'-bis(9-phenyl-9H-carbazol-3-yl) biphenyl-4,4'-diamine, N-(biphenyl-4-yl)-9,9-dimethyl-N-(4-(9-phenyl-9H-carbazol-3-yl)phenyl)-9H-fluoren-2-amine, 2-(4-(9,10-bis(naphthalene-2-yl)anthracene-2-yl)phenyl)-1-phenyl-1H-benzo-[D]imidazole, 4,4',4"-tris(N-3-methylphenyl-N-phenylamino)triphenylamine, N,N'-bis(1-naphthyl)-N,N'-diphenyl [1,1'-biphenyl]-4,4'-diamine or 4,4'-Bis [N-(3-methylphenyl)-N-phenylamino]biphenyl, BAlq(bis(2-methyl-8-hydroxyquinoline)-4-(p-phenylphenol))aluminum alloy), or TAZ (3-(biphenyl-4-yl)-5-(4-tert-butylphenyl)-4-phenyl-4H-1,2,4-triazole).

S3. preparing a first electrode layer on the light-emitting unit layer and the auxiliary layer. The first electrode layer covers the light-emitting unit layer and at least part of the edge part, and a thickness of the first electrode layer located on the edge part is less than a thickness of the first electrode layer located on the light-emitting unit layer.

Specifically, a first electrode layer is deposited on the third light-emitting unit layer and the auxiliary layer, the first electrode layer covers the third light-emitting unit layer and at least part of the edge part. The first electrode layer is a non-transparent electrode layer, it has a function of reflecting the light emitted by the third light-emitting unit layer, and at the same time has a function of blocking external light from entering the display panel through the light-transmitting area.

Since the material of the auxiliary layer is an anti-adhesion material, the anti-adhesion material does not match the surface energy of the material of the first electrode layer, and the material of the third light-emitting unit layer is a non-adhesion-proof material, which matches the surface energy of the material of the first electrode layer, so that an adhesive force of the first electrode layer on the auxiliary layer is less than an adhesive force of the first electrode layer on the third light-emitting unit layer, and a thickness of the first electrode layer located on the auxiliary layer is less than a thickness of the first electrode layer located on the third light-emitting unit layer. Since the adhesive force of the first electrode layer on the auxiliary layer gradually decreases as the thickness of the auxiliary layer increases, and when the thickness of the auxiliary layer reaches a certain value d, the adhesive force of the first electrode layer on the auxiliary layer reaches a limit value. The first electrode layer shall be unable to adhere to the auxiliary layer, i.e., the first electrode layer is not provided on the auxiliary layer with a thickness greater than the value d, thus the first electrode layer covers at least part of the edge part of the auxiliary layer, and the thickness of the first electrode layer located on the edge part gradually decreases in a direction in which the thickness of the edge part increases. The thickness of the first electrode layer located at the edge of the auxiliary layer is the same as the thickness of the first electrode layer located on the third light-emitting unit layer. This makes the thickness of the first electrode layer transition smoothly at the boundary of the light-transmitting area, thereby greatly reducing the cathode step difference at the boundary of the light-transmitting area, alleviating the phenomenon of uneven brightness at the boundary of the light-transmitting area, and improving the brightness uniformity of the display panel.

The embodiment of the present invention provides a method for manufacturing a display panel. The method provides an auxiliary part in the light-transmitting area, and a first electrode layer is disposed on the light-emitting unit layer and the auxiliary part. The first electrode layer covers the light-emitting unit layer and at least part of the edge part, and a thickness of the first electrode layer located on the edge part is less than a thickness of the first electrode layer located on the light-emitting unit layer, thereby reducing the cathode step difference at the boundary of the light-transmitting area, alleviating the phenomenon of uneven brightness at the boundary of the light-transmitting area, and improving the brightness uniformity of the display panel.

In an embodiment, the present invention further provides a display device, which includes any display panel provided in the embodiments of the present invention and has technical features and technical effects of any display panel provided in the embodiments of the present invention. For specific implementation and working principles, please refer to the foregoing specific embodiments, which will not be repeated herein.

In summary, the embodiments of the present invention provide a display panel and a method for manufacturing the same, and a display device. The display panel is provided with the auxiliary part in the light-emitting area, the first electrode layer covers the light-emitting unit layer and at least part of the edge part, and a thickness of the first electrode layer located on the edge part is less than a thickness of the first electrode layer located on the light-emitting unit layer, thereby reducing the cathode step difference at the boundary of the light-transmitting area, alleviating the phenomenon of uneven brightness at the boundary of the light-transmitting area, and improving the brightness uniformity of the display panel.

The display panel and the display device provided in the embodiments of the present invention are described in detail above. The principle and implementations of the present invention are described in this specification by using specific examples. The description about the foregoing embodiments is merely provided to help understand the method and core ideas of the present invention. In addition, those skilled in the art can make modifications in terms of the specific implementations and application scopes according to the ideas of the present invention. Therefore, the content of this specification shall not be construed as a limit to the present invention.

What is claimed is:

1. A display panel comprising a first display area and a second display area, wherein a light transmittance of the first display area is greater than a light transmittance of the second display area; in the first display area, the display panel comprises pixel areas and a light-transmitting area defined between the pixel areas, and the display panel comprises:
   a light-emitting unit layer;
   an auxiliary layer comprising at least one auxiliary part, wherein the auxiliary part is disposed in a corresponding light-transmitting area; and
   a first electrode layer disposed on the light-emitting unit layer and the auxiliary layer,
   wherein the auxiliary part comprises a platform part and an edge part arranged at an edge of the platform part, the first electrode layer covers the light-emitting unit layer and at least part of the edge part, and a thickness of the first electrode layer located on the edge part is less than a thickness of the first electrode layer located on the light-emitting unit layer;
   wherein the first electrode layer completely covers the edge part and the platform part on the auxiliary layer.

2. The display panel as claimed in claim 1, wherein an adhesive force of the first electrode layer on the auxiliary layer is less than an adhesive force of the first electrode layer on the light-emitting unit layer.

3. The display panel as claimed in claim 2, wherein a thickness of the first electrode layer located on the auxiliary part is less than the thickness of the first electrode layer located on the light-emitting unit layer.

4. The display panel as claimed in claim 2, wherein the adhesive force of the first electrode layer on the auxiliary layer gradually decreases as a thickness of the auxiliary layer increases.

5. The display panel as claimed in claim 4, wherein the thickness of the first electrode layer located on the edge part gradually decreases in a direction in which a thickness of the edge part increases.

6. The display panel as claimed in claim 5, wherein the thickness of the edge part gradually decreases in a direction away from the platform part.

7. The display panel as claimed in claim 1, wherein the thickness of the first electrode layer located on the light-emitting unit layer ranges from 100 nanometers to 150 nanometers.

8. The display panel as claimed in claim 1, further comprising a pixel definition layer, wherein the pixel definition layer is patterned to form openings of the pixel definition layer, and a distance between an edge of the auxiliary part and one of the openings of the pixel definition layer adjacent to the edge of the auxiliary part ranges from 2 microns to 5 microns.

9. The display panel as claimed in claim 1, wherein a width of a projection of the edge part on the light-emitting unit layer ranges from 2 microns to 5 microns.

10. The display panel as claimed in claim 1, wherein a contact angle between the auxiliary part and the light-emitting unit layer ranges from 0 degrees to 90 degrees.

11. The display panel as claimed in claim 1, wherein a thickness of the platform part is less than or equal to the thickness of the first electrode layer located on the light-emitting unit layer.

12. A display device comprising a display panel, wherein the display panel comprises a first display area and a second display area, a light transmittance of the first display area is greater than a light transmittance of the second display area, in the first display area, the display panel comprises pixel areas and a light-transmitting area defined between the pixel areas, and the display panel comprises:
   a light-emitting unit layer;
   an auxiliary layer comprising at least one auxiliary part, wherein the auxiliary part is disposed in a corresponding light-transmitting area; and
   a first electrode layer disposed on the light-emitting unit layer and the auxiliary layer,
   wherein the auxiliary part comprises a platform part and an edge part arranged at an edge of the platform part, the first electrode layer covers the light-emitting unit layer and at least part of the edge part, and a thickness of the first electrode layer located on the edge part is less than a thickness of the first electrode layer located on the light-emitting unit layer; a thickness of the first electrode layer on a side of the edge part away from the platform part is equal to the thickness of the first electrode layer located on the light-emitting unit layer; and
   wherein the first electrode layer completely covers the edge part on the auxiliary layer.

13. The display device as claimed in claim 12, wherein a thickness of the first electrode layer located on the auxiliary part is less than the thickness of the first electrode layer located on the light-emitting unit layer.

14. The display device as claimed in claim 13, wherein the thickness of the first electrode layer located on the edge part gradually decreases in a direction in which a thickness of the edge part increases.

15. A display device comprising a display panel, wherein the display panel comprises a first display area and a second display area, a light transmittance of the first display area is greater than a light transmittance of the second display area, in the first display area, the display panel comprises pixel areas and a light-transmitting area defined between the pixel areas, and the display panel comprises:
   a light-emitting unit layer;
   an auxiliary layer comprising at least one auxiliary part, wherein the auxiliary part is disposed in a corresponding light-transmitting area; and
   a first electrode layer disposed on the light-emitting unit layer and the auxiliary layer,
   wherein the auxiliary part comprises a platform part and an edge part arranged at an edge of the platform part, the first electrode layer covers the light-emitting unit layer and at least part of the edge part, and a thickness of the first electrode layer located on the edge part is less than a thickness of the first electrode layer located on the light-emitting unit layer;
   wherein the first electrode layer completely covers the edge part and the platform part on the auxiliary layer.

* * * * *